United States Patent
Hulett

(10) Patent No.: US 9,835,649 B1
(45) Date of Patent: Dec. 5, 2017

(54) RECONFIGURABLE LED LOAD BOARD CLAMP

(71) Applicant: Vektrex Electronic Systems, Inc., San Diego, CA (US)

(72) Inventor: Jeffery Neil Hulett, Encinitas, CA (US)

(73) Assignee: Vektrex Electronic Systems, Inc., San Diego, CA (US)

( * ) Notice: Subject to any disclaimer, the term of this patent is extended or adjusted under 35 U.S.C. 154(b) by 165 days.

(21) Appl. No.: 14/752,363

(22) Filed: Jun. 26, 2015

Related U.S. Application Data

(60) Provisional application No. 62/017,694, filed on Jun. 26, 2014.

(51) Int. Cl.
  *G01R 1/04* (2006.01)
  *G01R 31/44* (2006.01)
  *G01R 31/28* (2006.01)

(52) U.S. Cl.
  CPC ......... *G01R 1/0433* (2013.01); *G01R 1/0425* (2013.01); *G01R 31/2877* (2013.01); *G01R 31/44* (2013.01)

(58) Field of Classification Search
  CPC ............ G01R 31/2891; G01R 31/2877; G01R 31/2868; G01R 31/2874; G01R 1/0458
  USPC .................................................. 324/750.09
  See application file for complete search history.

(56) References Cited

U.S. PATENT DOCUMENTS

| | | | | |
|---|---|---|---|---|
| 5,436,420 A | * | 7/1995 | McFarlin, III | H01R 4/5008 200/82 R |
| 5,768,049 A | * | 6/1998 | Morehouse | G11B 25/043 360/97.21 |
| 6,437,586 B1 | * | 8/2002 | Robinson | G01R 1/0433 324/756.02 |
| 6,636,062 B2 | * | 10/2003 | Gaasch | G01R 1/0458 324/750.03 |
| 7,514,946 B2 | * | 4/2009 | Soeta | G01R 31/2865 324/750.09 |
| 8,040,145 B2 | * | 10/2011 | Kabbani | H01L 23/473 324/750.09 |
| 8,212,156 B2 | * | 7/2012 | Brodsky | H05K 3/4015 174/261 |
| 2004/0036492 A1 | * | 2/2004 | Gaasch | G01R 1/0458 324/750.09 |
| 2006/0186909 A1 | * | 8/2006 | Aube | G01R 31/2875 324/750.09 |
| 2007/0052434 A1 | * | 3/2007 | Liao | G01R 31/2817 324/750.09 |
| 2009/0141463 A1 | * | 6/2009 | Sholl | H05K 7/1407 361/758 |

(Continued)

*Primary Examiner* — Jermele M Hollington
*Assistant Examiner* — Christopher McAndrew
(74) *Attorney, Agent, or Firm* — Sheppard Mullin; Daniel Yannuzzi; Jonathan Marina

(57) ABSTRACT

A reconfigurable load board clamp is disclosed. The reconfigurable load board clamp includes first and second slotted ends; first and second opposing sides laterally coupled to the first and second slotted ends; and a MCPCB pin board removably coupled to the first and second slotted ends. The pin board includes a card edge connector plugged into an end of the pin board and multiple spring-loaded pin connectors. In implementations, multiple pin boards may be removed and added to the reconfigurable load board clamp to form a pin array suitable for a particular load board.

20 Claims, 5 Drawing Sheets

(56) References Cited

U.S. PATENT DOCUMENTS

2009/0321125 A1* 12/2009 Brodsky .............. H05K 3/4015
                                                  174/263
2013/0147347 A1*  6/2013 Laporte ................. F21V 5/007
                                                  313/512

* cited by examiner

RECONFIGURABLE LED LOAD BOARD CLAMP

CROSS-REFERENCE TO RELATED APPLICATIONS

This application claims the benefit of U.S. Provisional Application No. 62/017,694, filed Jun. 26, 2014, which is incorporated herein by reference in its entirety.

TECHNICAL FIELD

The present invention relates generally to load board clamps, and more particularly, some embodiments relate to a reconfigurable light emitting diode (LED) load board clamp.

BACKGROUND

Load Boards are custom-made printed circuit boards (PCB) that act as an interface between automated test equipment (ATE) and a device under test (DUT). The load board provides an electrical and mechanical interface between the ATE and DUT. Generally, a load board includes one or more sockets for the DUT, interface pads for the ATE, and electrical components (e.g., resisters, capacitors, inductors, etc.) needed for the DUT. In some instances, the DUT may be soldered to the load board.

LEDs undergoing reliability stress tests are frequently soldered to load boards that connect the LEDS in series or parallel circuits so that they may be driven from a common power source. During LED testing the load board serves as a heat transfer medium. Excessive heat from the LED junction is transferred by conduction to a heatsink or temperature control platform under the load board. To maximize heat transfer, the load board is firmly clamped by a clamping mechanism to the temperature control platform, thereby minimizing any air gaps that may slow heat transfer. This may be done with regularly placed screws, lever clamps, or other means. Many of these means rely upon a few discrete, common contact points. Pressure applied at these common points is then distributed by the load board to the structure of the load board itself.

However, the best materials for load boards are soft metals such as aluminum and copper. These materials may easily deform under point loads, resulting in a non-uniform clamping force. In some instances, air gaps may form. To mitigate this problem, load board clamping mechanisms have been designed with highly distributed pressure points, created using spring-loaded electrical connectors called pogo pins. Although each pogo pin does not apply much force, the pogo pins are small and many can be positioned in a regular array to produce a uniform clamping force. Additionally, because the pogo pins are conductive, they may serve as electrical contacts for the load board, thereby eliminating the need for a connector.

Although pogo pin arrays effectively distribute the clamping force, each array must be custom built to exactly fit the load board's corresponding LED pattern. Accordingly, each LED board type requires designing a different clamp to implement the correct array. As most laboratories utilize dozens of different load board types, this method is expensive and cumbersome.

SUMMARY OF THE DISCLOSURE

In various embodiments, a reconfigurable load board clamp is disclosed. In one embodiment, the load board clamp may include first and second slotted ends; first and second opposing sides laterally coupled to the first and second slotted ends; and a metal core printed circuit board (MCPCB) pin board removably coupled to the first and second slotted ends. The pin board includes: a card edge connector plugged into an end of the pin board; and a plurality of spring-loaded pin connectors. Each of the slotted ends includes one or more slots for receiving an end of a pin board.

In embodiments, multiple MCPCB pin boards may be removed from or coupled to the slotted ends. In an implementation of these embodiments, the multiple pin boards are slidingly coupled to a first and second slot on the first and second slotted ends, respectively.

In another embodiment of the technology disclosed herein, a testing assembly includes: a load board; a thermal platform configured to cool the load board; and a reconfigurable load board clamp coupled to the load board and configured to secure the load board to the thermal platform. In one implementation of this embodiment, the testing assembly includes multiple load boards coupled to the thermal platform; and multiple reconfigurable load board clamps, each of the multiple reconfigurable load board clamps coupled to a respective one of the multiple load boards. In another implementation of this embodiment, the testing assembly includes multiple reconfigurable load board clamps, each of the multiple reconfigurable load board clamps coupled to the load board.

In yet another embodiment of the technology disclosed herein, a lighting testing assembly includes: multiple load boards, each of the load boards including one or more lighting devices under test; a thermal platform configured to cool the multiple load boards, where the multiple load boards are directly coupled to the thermal platform; and multiple reconfigurable load board clamps coupled to the multiple load boards and configured to secure the multiple load boards to the thermal platform.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The various embodiments are described in detail with reference to the following figures. The drawings are provided for purposes of illustration only and merely depict typical or example embodiments. These drawings are provided to facilitate the reader's understanding of the invention and shall not be considered limiting of the breadth, scope, or applicability of the invention. It should be noted that for clarity and ease of illustration these drawings are not necessarily made to scale.

The figures are not intended to be exhaustive or to limit the invention to the precise form disclosed. It should be understood that the embodiments and invention can be practiced with modification and alteration, and that the invention be limited only by the claims and the equivalents thereof.

DETAILED DESCRIPTION

The present embodiments are directed toward reconfigurable load board clamps that may clamp load boards of various designs to a thermal platform. The disclosed reconfigurable load board clamp includes slots for receiving removable pin boards with different spring-loaded pin connector configurations, thereby allowing simple reconfiguration of the pin array on the clamp for use with different load board designs. Additionally, the removable pin boards convey electrical signals, thereby eliminating the need for point-to-point wiring.

The particular embodiments described herein are directed to reconfigurable clamps for use with load boards that mount LEDs, arrays, chip-on-board (COB) lights, emitters, luminaires and other lighting undergoing reliability tests. However, it should be noted that one having skill in the art would appreciate that the disclosed reconfigurable load board clamps could be utilized with load boards that perform reliability testing on devices other than lighting. It is also worth noting that in accordance with embodiments described herein, a single reconfigurable clamp may be used alone to clamp a single load board roughly the size of the clamp, or multiple reconfigurable clamps may be used together to clamp larger load boards that are an integer multiple of the clamp size.

Figure 1A:
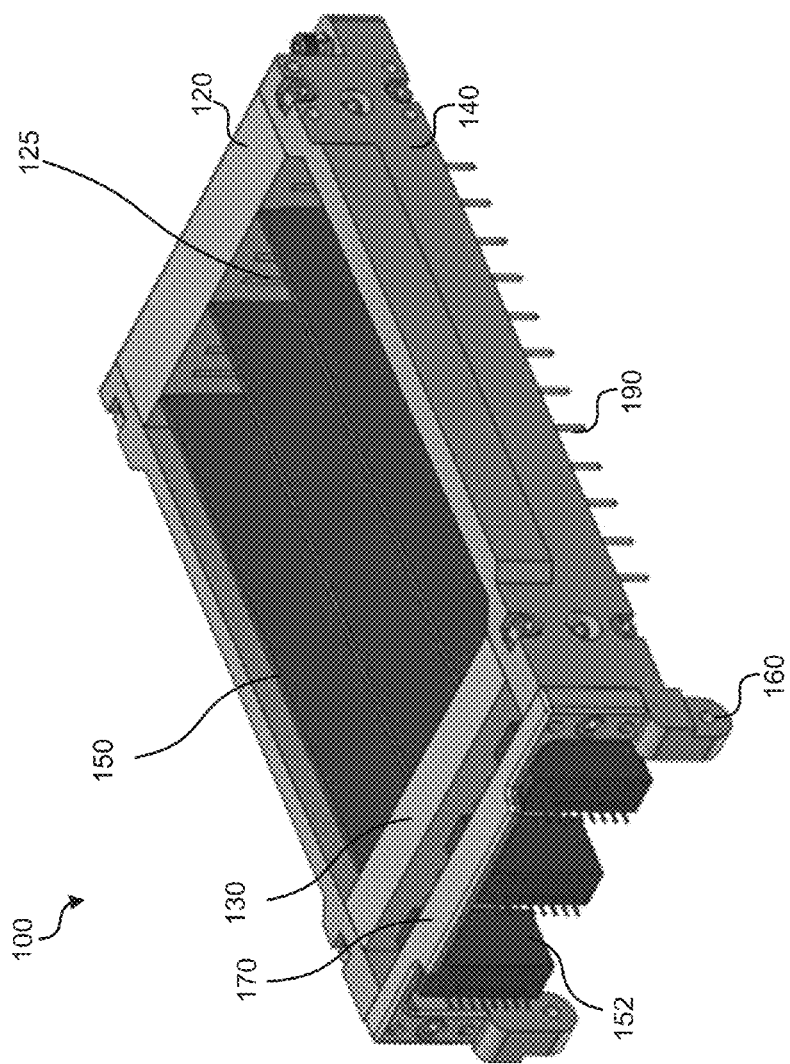
FIG. 1A is a top perspective view of an assembled, reconfigurable load board clamp in accordance with an embodiment of the technology disclosed herein.
Figure 1B:
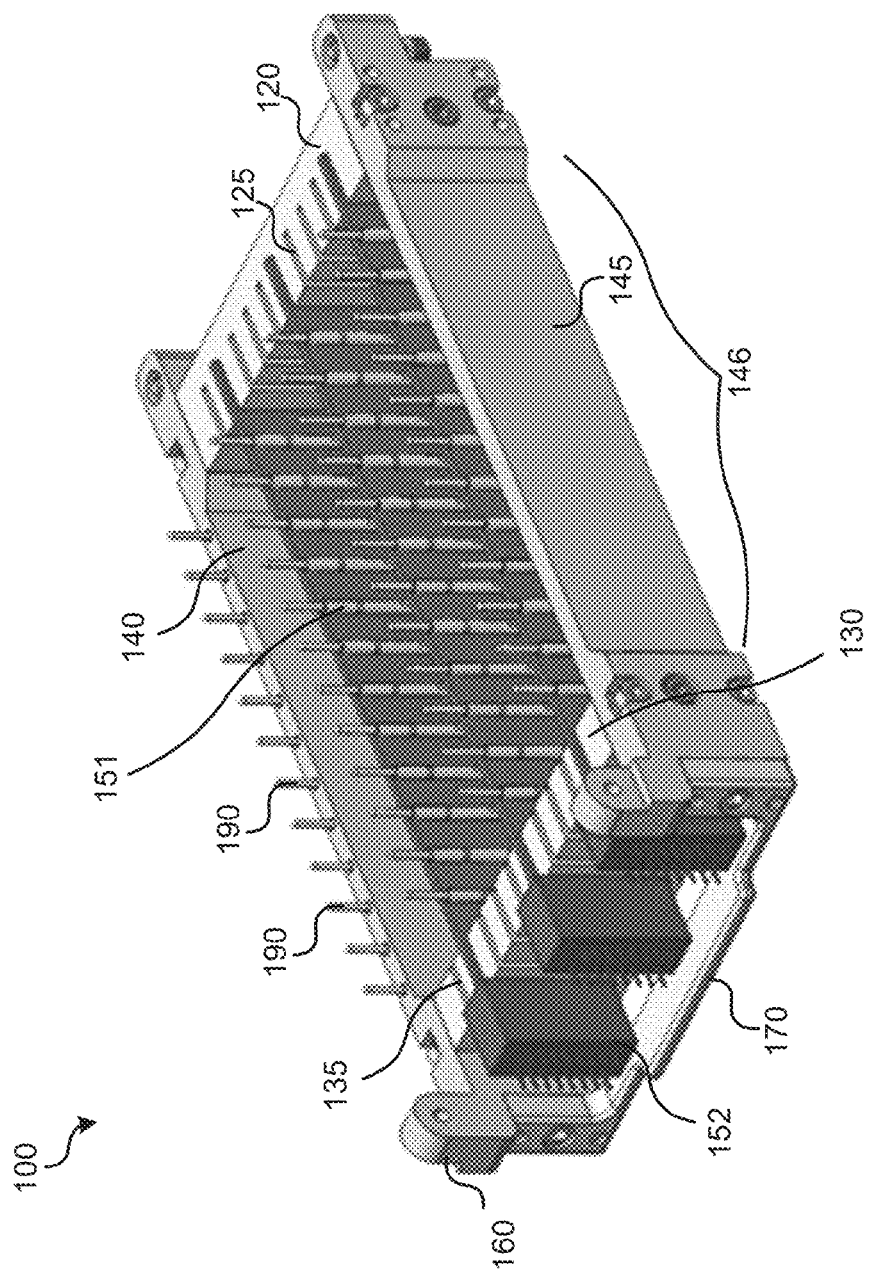
FIG. 1B is a bottom perspective view of the reconfigurable load clamp of FIG. 1A.
Figure 1C:
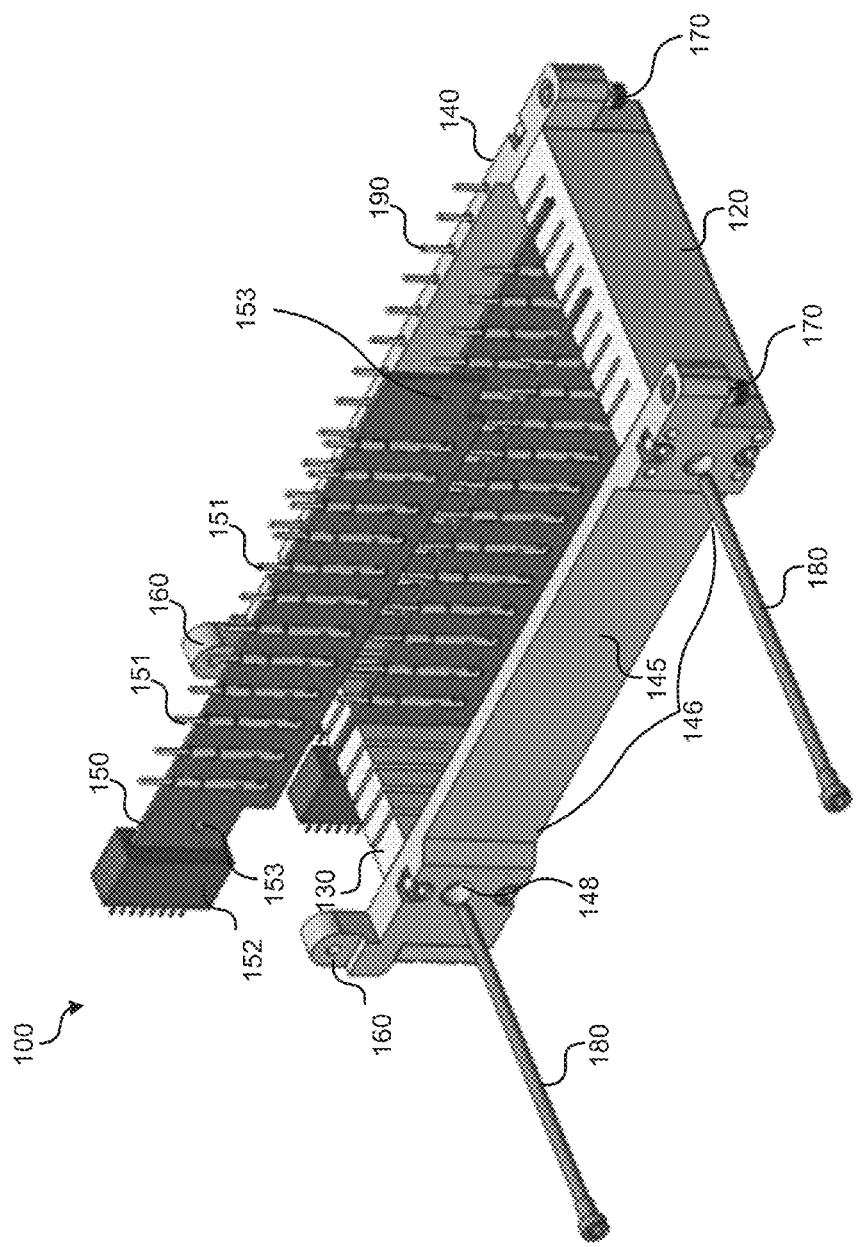
FIG. 1C is a bottom perspective view of the reconfigurable load board clamp of FIG. 1A during reconfiguration.

FIGS. 1A-1C illustrate one such embodiment of a reconfigurable load board clamp 100 that may be used with load boards that test lighting such as LEDs. In particular, FIG. 1A is a top perspective view of an assembled, reconfigurable load board clamp 100 in accordance with an embodiment of the technology disclosed herein. FIG. 1B is a bottom perspective view of the reconfigurable load clamp 100. And FIG. 1C is a bottom perspective view of the reconfigurable load board clamp 100 during pin board reconfiguration. As illustrated, load board clamp 100 comprises opposing sides 140 and 145 laterally coupled to slotted ends 120 and 130. A plurality of metal core printed circuit board (MCPCB) pin boards 150 are removably coupled to slotted ends 120 and 130.

Each pin board 150 is removably coupled to clamp 100 via a pair of planar slots 125 and 135 corresponding to respective slotted ends 120 and 130. As illustrated in this embodiment, slotted ends 120 and 130 include a first and a second plurality of corresponding slots 125 and 135 for receiving multiple pin boards 150. Alternatively, each of ends 120 and 130 may include only a single slot. In embodiments, pin board 150 may couple to slots 125 and 135 by sliding, snap fitting, or other means. In embodiments, each slot 125 and 135 may be identified with ruling marks to identify its location on an axis.

Slotted ends 120 and 130 may be formed of a high temperature plastic with a working temperature rating that exceeds the maximum test temperatures (e.g., at least 120 C), such as PEEK, ULTEM®, and the like. In these embodiments, the high temperature plastic provides a high resistance to thermal deformation due to heat produced during load board testing, and a flexible location for pin boards 150.

In one embodiment, illustrated by FIG. 1C, a pair of retention pins 180 may additionally secure pin boards 150 to slotted ends 120 and 130. In this embodiment, the retention pins may be mounted through receiving apertures 148 laterally formed through one or more of slotted ends 120 and 130 and corresponding receiving apertures 153 formed through pin boards 150. In a particular implementation of this embodiment, retention pins 180 may be threaded and one or both of apertures 148 and 153 may comprise receiving threads. Alternatively, retention pins 180 may be spring-loaded and secured through apertures 148 and 153 by applying pressure. In another embodiment, apertures 148 are formed only through a notched side 145 of clamp 100.

Each MCPCB pin board 150 includes a plurality of spring-loaded connector pins (e.g., pogo pins) 151 and a card edge connector 152 plugged into an end of pin board 150. Card edge connector 150 includes contacts for electrically coupling pin board 150 to a load board and may be formed of a suitable higher temperature material with a working temperature rating that exceeds the clamp's planned testing temperature (e.g., at least 120 C for LED testing), such as PEEK, ULTEM®, and the like. Pins 151 provide clamping pressure on a load board, and in particular embodiments, some or all of pins 151 may provide an electrical connection to traces on pin board 150.

The metal core of pin boards 150 provides a high thermal conductivity that may disperse heat that develops in board 150, thereby keeping pins 151 within their temperature limit. In embodiments, the metal core of pin boards 150 may be aluminum, copper, heavy copper, or another suitable metal.

In embodiments, an array of spring-loaded connector pins 151 may be soldered in a predetermined, uniform pattern to pin board 150. For example, the pattern may be created based on the placement of devices under test (DUT) on the load board, the load board's corresponding contacts, the amount and spacing of pins 151 needed to uniformly distribute pressure, the durability of pins 151, and other factors.

Based on the predetermined patterns of pin boards 150, a pin array of clamp 100 may be configured for a particular load board by selectively removing or attaching one or more pin boards 150 to clamp 100. The configuration of the pin array may be changed by changing the spacing between pins, adding additional pins, and removing pins. For example, prior to reconfiguration, clamp 100 may be in a first assembled configuration illustrated by FIGS. 1A-1B. The first assembled configuration may have a pin array suitable for a first load board. For example, the first assembled configuration may include three pin boards 150 removably coupled to three corresponding pairs of slots 125, 135 and further secured by retention pins 180.

Subsequently, If a tester needs to change the pin array configuration, the tester may proceed as follows. First, the tester may remove retention pins 180 from notched side 145 of clamp 100, thereby providing access to slots 125 and 135 as illustrated in FIG. 1C. Afterward, the tester may change the pin array by: 1) removing the original pin boards from their respective slots; 2) moving the original pin boards to different slots; and/or 3) inserting new pin boards into the slots. Subsequently, the retention pins 180 may be reinserted, thereby completing a newly assembled pin array configuration. This new configuration may be suitable for a second load board. Alternatively, in embodiments where the clamp couples to a portion of the first load board, the newly assembled pin array configuration may be suitable for coupling to a different portion of the first load board.

Figure 2:
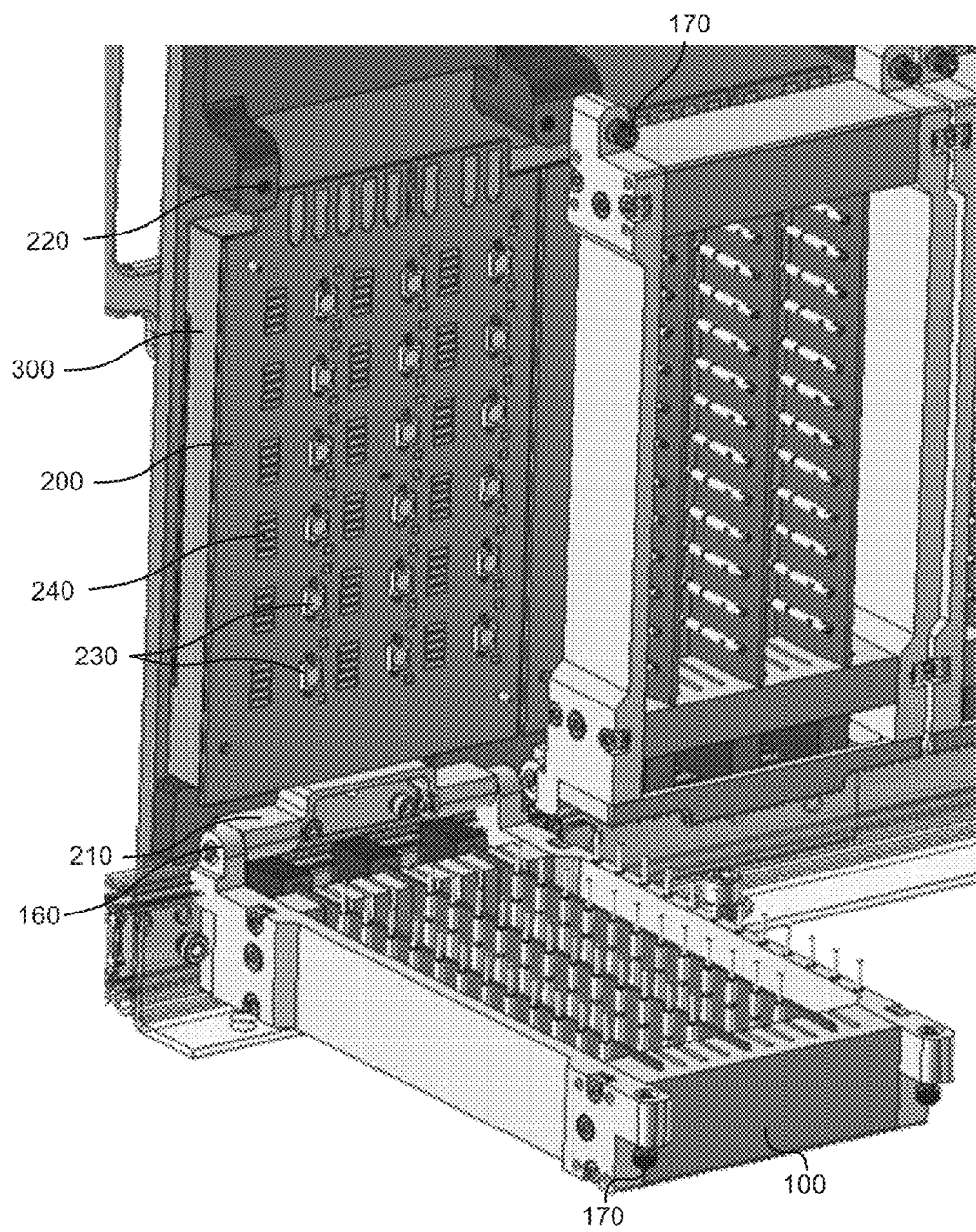
FIG. 2 illustrates an assembly including a LED load board, a thermal platform for the load board, and a reconfigurable load board clamp in accordance with an embodiment of the technology disclosed herein.

Sides 140 and 145 directly couple to lateral sides of slotted ends 120 and 130, forming the basic structure of clamp 100. In embodiments, sides 140 and 145 may be formed of aluminum, copper, or other suitable metal. Each side 140 and 145 includes a pivot point 160 and captive fastener 170 for securing clamp 100 to a load board as illustrated in FIG. 2, further described below. In a particular embodiment, clamp 100 may include a metallic stiffener 170 secured to the ends of sides 140 and 145 that are proximal to pivot points 160. Metallic stiffener 170 provides additional structural integrity to clamp 100 in the area around pivot points 170 and may be constructed of aluminum, titanium, or other suitable metal.

In embodiments, spring-loaded connector pins (e.g., pogo pins) 190 may be placed on side 140, side 145, or both to apply additional pressure when mounted on a load board. In further embodiments, a side 145 may include a notch or indentation 146, thereby allowing neighboring clamps to nest within each other, the placement of load boards next to each other, and/or the placement of pins 190 within at least one of sides 140, 145 to provide pressure close to the edge of a load board. In one particular embodiment, a notch 146 may offset the clamping pin array slightly to accommodate off-center LED arrays.

FIG. 2 illustrates an assembly including a LED load board 200, a thermal platform 300 for the LED load board, and a reconfigurable load board clamp 100 in accordance with an embodiment of the technology disclosed herein. Pivot points 160 of clamp 100 attach to LED load board 200 at hinge 210. In this configuration, clamp 100 is hinged to pivot from the bottom of load board 200. Accordingly, clamp 100 remains open under the force of gravity, thereby eliminating the need for spring-loaded elements in pivot points 160. Additionally edge card connectors 152 electrically couple clamp 100 to load board 200 near this pivot point.

Clamp 100 may be secured in the closed position (i.e., clamped and secured to load board 200) by 1) pivoting it upward until spring-loaded electrical connector pins 151 pressure contact one or more corresponding contact elements 240 on load board 200; and 2) securing captive fasteners 170 to corresponding receivers 220. Once fastened, the array of pins 151 produce a uniform clamping force and may serve as electrical contacts for testing equipment. Subsequently, an array of LEDS 230 coupled to load board 200 may be tested.

It is worth noting that the slender, vertical profile of pin boards 150 minimizes the surface area of clamp 100 that directly blocks light from LEDs 230 during testing, which is an important requirement in LED testing systems. Additionally, the small profile of pin boards 150 reduces the heating of pin boards 150 by optical radiation from LEDs 230, thereby maintaining their integrity during testing.

Figure 3:
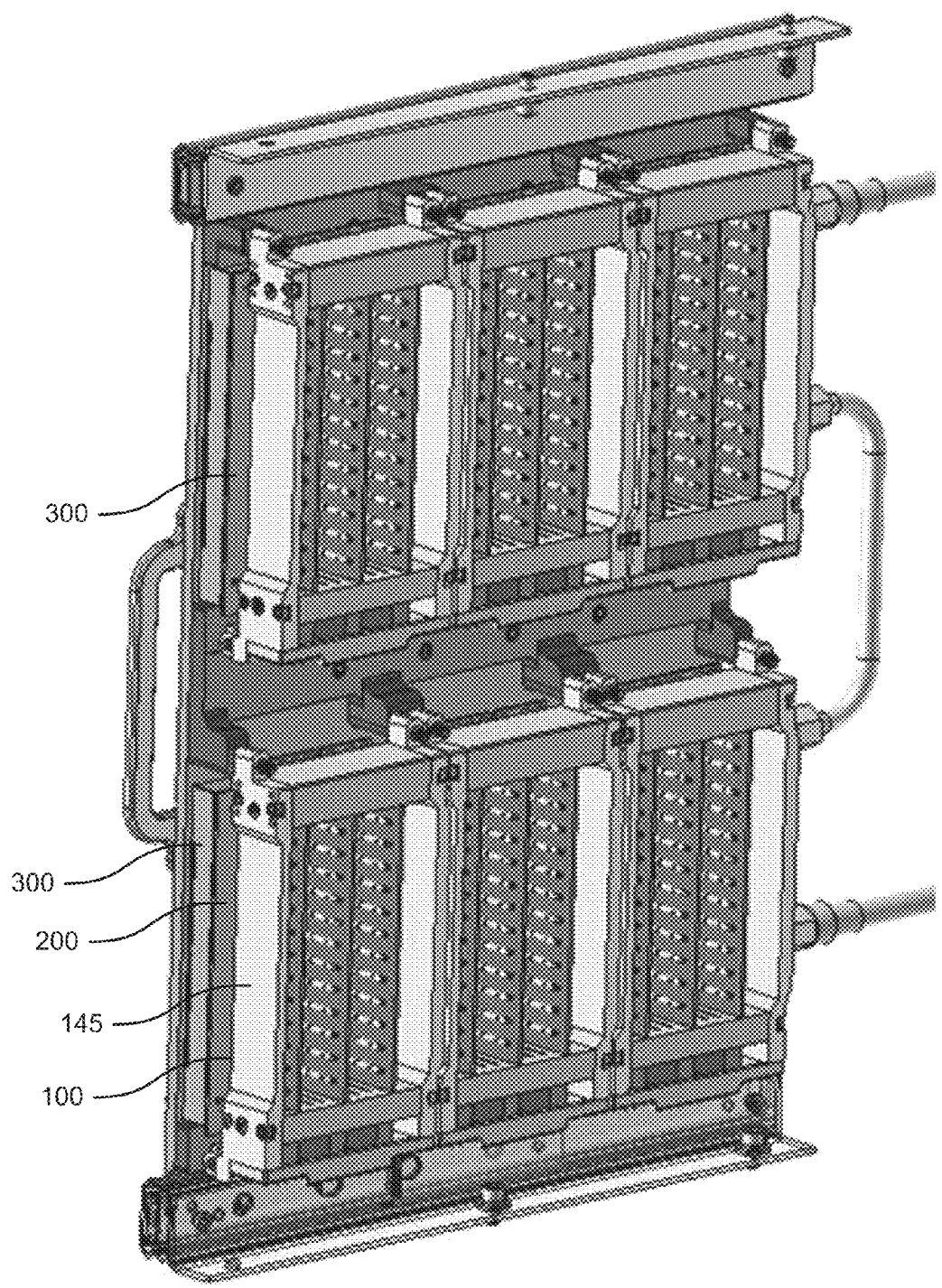
FIG. 3 illustrates an assembly including a pair of thermal platforms, a plurality of load boards, and a corresponding plurality of reconfigurable load board clamps that are clamped to each of the load boards in accordance with an embodiment of the technology disclosed herein.

FIG. 3 illustrates an assembly including a pair of thermal platforms 300, a plurality of load boards 200, and a corresponding plurality of reconfigurable load board clamps 100 in accordance with an embodiment of the technology disclosed herein. Each load board 200 is secured to thermal platform 300 by a respective reconfigurable load board clamp 100. Each of the load boards 100 includes a notched side 145, allowing the load boards 200 to be placed in closed proximity to each other and maximizing the number of load boards 200 that can be secured to thermal platform 300.

While various embodiments have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A reconfigurable load board clamp, comprising:
   first and second slotted ends, each of the slotted ends comprising a slot for receiving an end of a pin board;
   first and second opposing sides laterally coupled to the first and second slotted ends; and
   a metal core printed circuit board (MCPCB) pin board removably coupled to the first and second slotted ends, the pin board comprising:
      a card edge connector plugged into an end of the pin board; and
      a plurality of spring-loaded pin connectors.

2. The load board clamp of claim 1, further comprising a plurality of MCPCB pin boards removably coupled to the first and second slotted ends, each of the plurality of pin boards comprising:
   a card edge connector plugged into an end of the pin board; and
   a plurality of spring-loaded pin connectors.

3. The load board clamp of claim 2, wherein each of the plurality of pin boards is slidingly coupled to a first and second slot on the first and second slotted ends, respectively.

4. The load board clamp of claim 2, wherein the metal core of at least one of the plurality of pin boards is aluminum.

5. The load board clamp of claim 2, wherein the first and second slotted ends comprise a high-temperature plastic.

6. The load board clamp of claim 2, wherein the first and second opposing sides comprise aluminum.

7. The load board clamp of claim 2, wherein each of the first and second opposing sides comprises a pivot point and a captive fastener for securing the load board clamp to a load board.

8. The load board clamp of claim 7, further comprising a metallic stiffener configured to provide structural integrity to the clamp in an area near the pivot points.

9. The load board clamp of claim 2, wherein at least one of the plurality of spring-loaded pin connectors of each of the plurality of pin boards is electrically conductive and configured to contact a respective electrical contact on a load board when the load board clamp is clamped on the load board.

10. The load board clamp of claim 2, wherein one of the first and second opposing sides is notched.

11. The load board clamp of claim 2, further comprising a retention pin for securing the plurality of pin boards to the load board clamp.

12. A testing assembly comprising:
   a load board;
   a thermal platform configured to cool the load board;
   a reconfigurable load board clamp coupled to the load board and configured to secure the load board to the thermal platform, the reconfigurable load board clamp comprising:
      first and second slotted ends, each of the slotted ends comprising a slot for receiving an end of a pin board;
      first and second opposing sides laterally coupled to the first and second slotted ends; and
      a pin board removably coupled to the first and second slotted ends, the pin board comprising:
         a card edge connector plugged into an end of the pin board; and
         a plurality of spring-loaded pin connectors.

13. The testing assembly of claim 12, further comprising: a plurality of reconfigurable load board clamps, each of the plurality of reconfigurable load board clamps coupled to the load board.

14. The testing assembly of claim 12, further comprising:
   a plurality of load boards coupled to the thermal platform; and
   a plurality of reconfigurable load board clamps, each of the plurality of reconfigurable load board clamps coupled to a respective one of the plurality of load boards.

15. The testing assembly of claim 14, wherein each of the plurality of reconfigurable load board clamps comprises:
   first and second slotted ends, each of the slotted ends comprising a slot for receiving an end of a pin board;
   first and second opposing sides laterally coupled to the first and second slotted ends; and
   a pin board removably coupled to the first and second slotted ends, the pin board comprising:
      a card edge connector plugged into an end of the pin board; and
      a plurality of spring-loaded pin connectors.

16. The testing assembly of claim 15, wherein at least one of the first and second opposing sides for each of the plurality of reconfigurable load board clamps is notched.

17. The testing assembly of claim 12, wherein the load board clamp further comprises a plurality of pin boards removably coupled to the first and second slotted ends, each of the plurality of pin boards comprising:
   a card edge connector plugged into an end of the pin board; and
   a plurality of spring-loaded pin connectors.

18. The testing assembly of claim 17, wherein at least one of the plurality of spring-loaded pin connectors of each of the plurality of pin boards is electrically conductive and configured to contact a respective electrical contact on the load board when the load board clamp is clamped on the load board.

19. The testing assembly of claim 18, wherein:
   the testing assembly is a light emitting diode (LED) testing assembly; and
   the load board comprises a plurality of LEDs.

20. A lighting testing assembly comprising:
   a plurality of load boards, each of the plurality of load boards comprising one or more lighting devices under test;
   a thermal platform configured to cool the plurality of load boards, wherein the plurality of load boards are directly coupled to the thermal platform; and
   a plurality of reconfigurable load board clamps coupled to the plurality of load boards and configured to secure the plurality of load boards to the thermal platform.

* * * * *